United States Patent
Lin et al.

(10) Patent No.: US 9,099,388 B2
(45) Date of Patent: Aug. 4, 2015

(54) III-V MULTI-CHANNEL FINFETS

(75) Inventors: Hung-Ta Lin, Hsin-Chu (TW);
Chun-Feng Nieh, Hsin-Chu (TW);
Chung-Yi Yu, Hsin-Chu (TW);
Chi-Ming Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 426 days.

(21) Appl. No.: 13/278,601

(22) Filed: Oct. 21, 2011

(65) Prior Publication Data
US 2013/0099283 A1 Apr. 25, 2013

(51) Int. Cl.
*H01L 21/70* (2006.01)
*H01L 29/66* (2006.01)
*H01L 29/267* (2006.01)
*H01L 29/78* (2006.01)

(52) U.S. Cl.
CPC ........ *H01L 29/267* (2013.01); *H01L 29/66795* (2013.01); *H01L 29/785* (2013.01)

(58) Field of Classification Search
CPC ................ H01L 29/267; H01L 29/785; H01L 29/66795; H01L 21/76229; H01L 21/823431; H01L 27/12; H01L 27/1211
USPC .................... 257/190, 192, E29.091, E21.09; 438/478
See application file for complete search history.

(56) References Cited

U.S. PATENT DOCUMENTS

| | | | | |
|---|---|---|---|---|
| 4,937,204 A | * | 6/1990 | Ishibashi et al. | ................ 117/89 |
| 2008/0073667 A1 | * | 3/2008 | Lochtefeld | ..................... 257/190 |
| 2010/0301390 A1 | * | 12/2010 | Ko et al. | ........................ 257/190 |
| 2012/0001239 A1 | | 1/2012 | Ko et al. | |

* cited by examiner

*Primary Examiner* — Chuong A Luu
*Assistant Examiner* — Mozzam Hossain
(74) *Attorney, Agent, or Firm* — Slater & Matsil, L.L.P.

(57) ABSTRACT

A device includes insulation regions over portions of a semiconductor substrate, and a III-V compound semiconductor region over top surfaces of the insulation regions, wherein the III-V compound semiconductor region overlaps a region between opposite sidewalls of the insulation regions. The III-V compound semiconductor region includes a first and a second III-V compound semiconductor layer formed of a first III-V compound semiconductor material having a first band gap, and a third III-V compound semiconductor layer formed of a second III-V compound semiconductor material between the first and the second III-V compound semiconductor layers. The second III-V compound semiconductor material has a second band gap lower than the first band gap. A gate dielectric is formed on a sidewall and a top surface of the III-V compound semiconductor region. A gate electrode is formed over the gate dielectric.

17 Claims, 4 Drawing Sheets

US 9,099,388 B2

III-V MULTI-CHANNEL FINFETS

BACKGROUND

The speed of metal-oxide-semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. However, III-V compound semiconductor films need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming III-V compound semiconductors comprising group III and group V elements is provided in accordance with an embodiment. A fin field-effect transistor (FinFET), which uses an epitaxy III-V compound semiconductor region as a fin, is formed. The intermediate stages of manufacturing the FinFET in accordance with various embodiments are illustrated. Throughout the various views and illustrative embodiments, like reference numbers are used to designate like elements.

Figure 1:
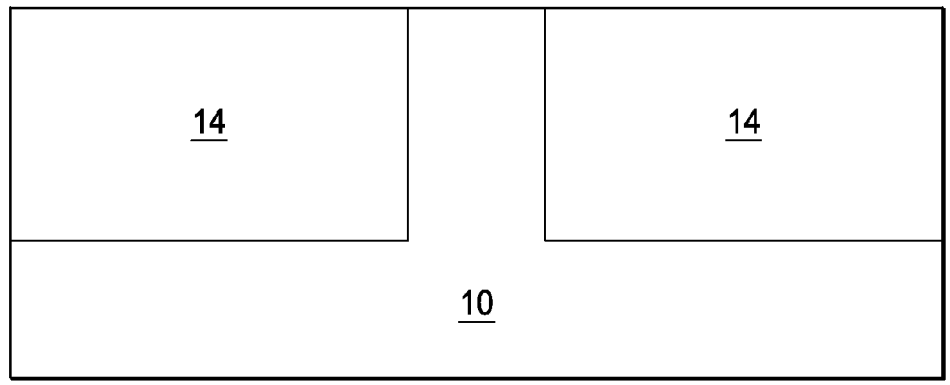
FIGS. 1 through 6B are cross-sectional views of intermediate stages in the manufacturing of a fin field-effect transistor (FinFET) in accordance with embodiments, wherein III-V compound semiconductor materials are grown to form the fin of the FinFET.

FIGS. 1 through 6B illustrate the cross-sectional views of intermediate stages in the manufacturing of a FinFET. Referring to FIG. 1, substrate 10, which is a part of semiconductor wafer 100, is provided. Substrate 10 may be a silicon substrate, although it may also be formed of other materials such as germanium, SiC, SiGe, GaAs, sapphire, or the like. Insulation regions such as shallow trench isolation (STI) regions 14 may be formed in substrate 10. Substrate 10 thus includes portions level with STI regions 14, and a portion under STI regions 14. The formation process of STI regions 14 may include etching substrate 10 to form recesses, filling the recesses with a dielectric material(s), and performing a planarization to remove excess dielectric materials.

Figure 2:
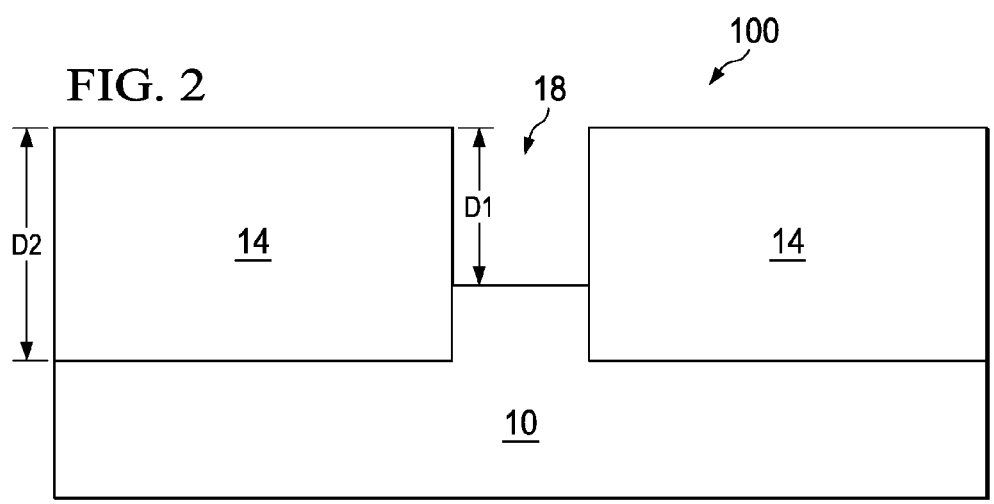

Next, as shown in FIG. 2, the portion of substrate 10 between opposite sidewalls of STI regions 14 is etched to form trench 18. Depth D1 of trench 18 may be substantially equal to or less than thickness D2 of STI regions 14. Depth D1 may be between about 50 nm and about 400 nm, for example. It is realized that the values recited throughout the description are merely examples, and may be changed to different values.

Figure 3:
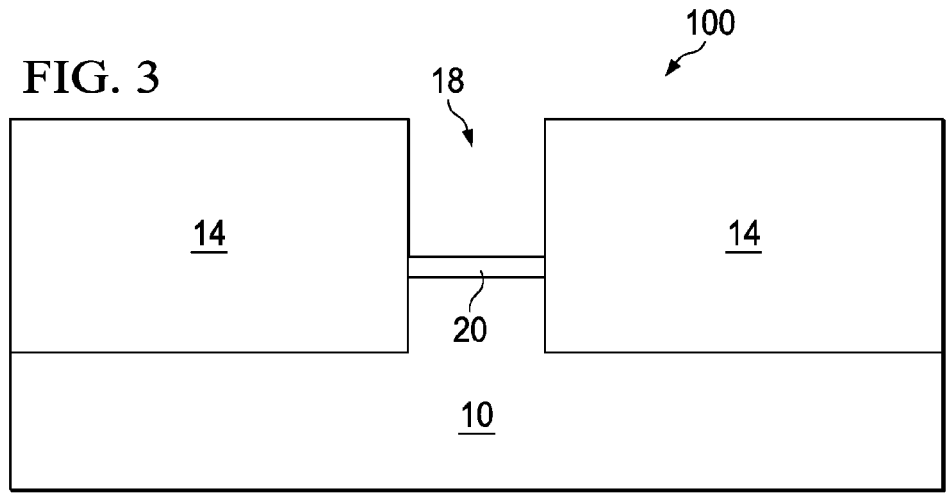

Referring to FIG. 3, optional buffer layer 20 is formed in trench 18, for example, through epitaxial growth. Buffer layer 20 may be formed of a semiconductor material, and may have a lattice constant between the lattice constant of substrate 10 and the lattice constants of the overlying III-V compound semiconductor region 22 (not shown in FIG. 3, please refer to FIG. 4A). In an exemplary embodiment, buffer layer 20 comprises InGaAs, which has a lattice constant between about 5.7 Å and about 6.0 Å for example, depending on the percentages of indium and gallium in InGaAs. In this exemplary embodiment, the lattice constant of buffer layer 20 is greater than the lattice constant of silicon, which is about 5.43 Å. In alternative embodiments, when the lattice constants of the overlying III-V compound semiconductor region 22 are smaller than that of silicon, the lattice constant of buffer layer 20 may also be smaller than that of silicon.

Figure 4A:
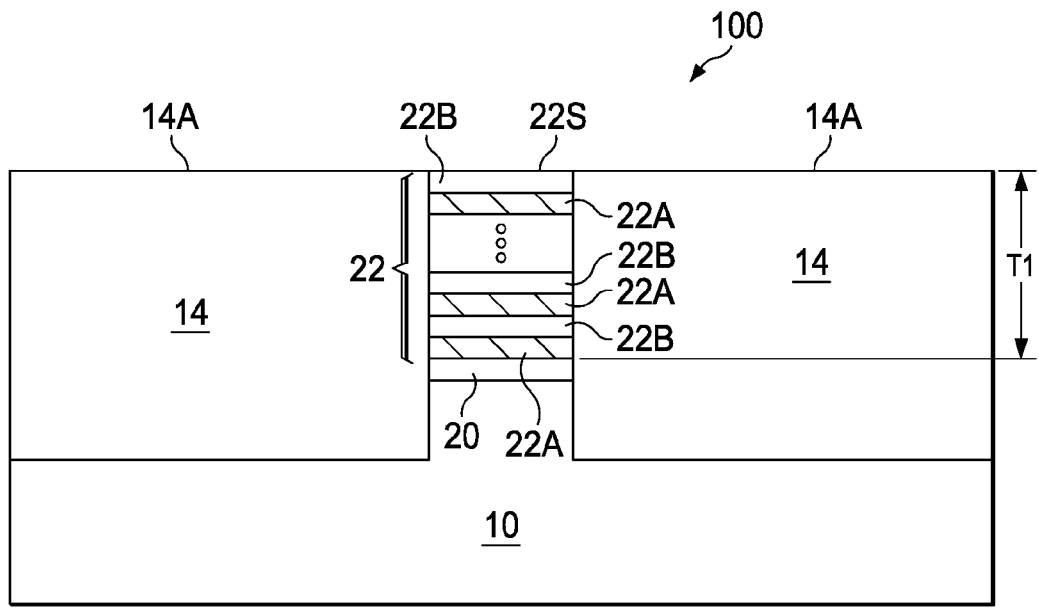
Figure 4B:
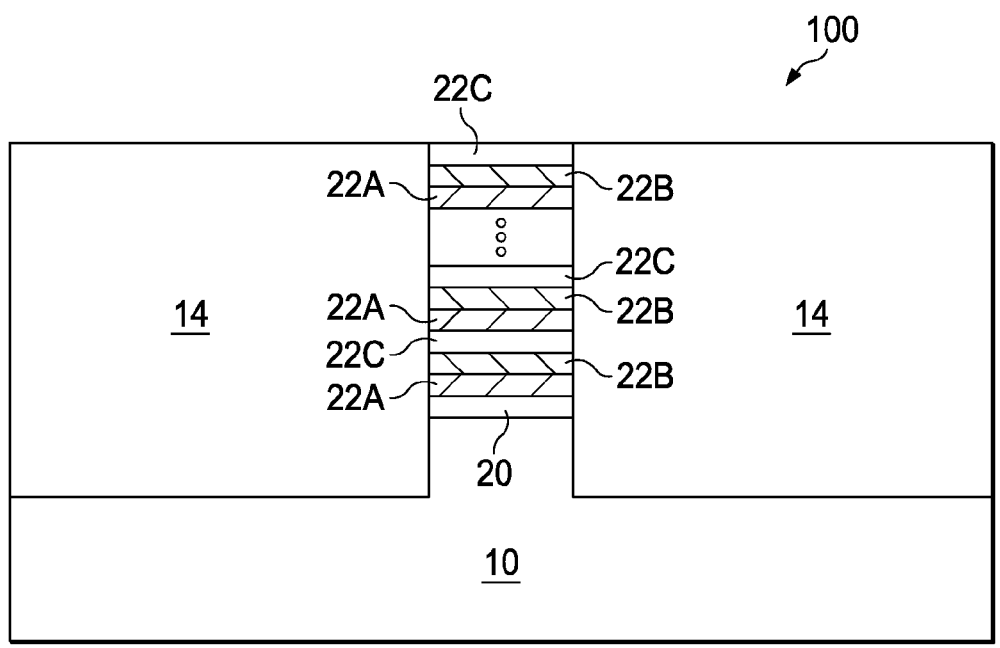

FIGS. 4A and 4B illustrate the formation of III-V compound semiconductor region 22, which is formed of III-V materials, and is grown in trench 18 (FIG. 3) through epitaxial growth. The top surface 22S of III-V compound semiconductor region 22 may be level with or lower than top surfaces 14A of STI regions 14. In an exemplary embodiment, thickness T1 of III-V compound semiconductor region 22 is greater than about 0.3 μm, for example, although different thicknesses may also be used. In the embodiments wherein buffer layer 20 is formed, III-V compound semiconductor region 22 is formed over, and may be in contact with, buffer layer 20. In alternative embodiments wherein no buffer layer 20 is formed, III-V compound semiconductor region 22 is formed over, and may be in contact with, the top surface of a portion of substrate 10.

In an embodiment, as shown in FIG. 4A, III-V compound semiconductor region 22 comprises III-V compound semiconductor layers 22A and 22B, which are stacked with an alternating pattern. III-V compound semiconductor layers 22A may be formed of a same (first) III-V compound semiconductor material, while III-V compound semiconductor layers 22B may be formed of a same (second) III-V compound semiconductor material. The first and the second III-V compound semiconductor materials may be different from each other, and may have different band gaps. The band gap difference between the first and the second III-V compound semiconductor materials may be greater than about 0.2 eV, or greater than about 2 eV, for example. The thickness of each of III-V compound semiconductor layers 22A and 22B may be smaller than about 20 Å, or smaller than about 100 Å, for example. The lattice constants of the first and the second III-V compound semiconductor materials may also be different from each other. The available materials for forming III-V compound semiconductor layers 22A and 22B include, but are not limited to, InAs, AlAs, GaAs, InP, GaN, InGaAs, InAlAs, GaSb, AlSb, AlP, GaP, and the like. In an exemplary embodiment, III-V compound semiconductor layers 22A are formed of AlAs, while III-V compound semiconductor layers 22B are formed of InAs. The band gap of AlAs is about 2.153 eV, and the band gap of InAs is about 0.36 eV. The lattice constant of AlAs is about 5.66 Å, and the lattice constant of InAs is about 6.05 Å.

In alternative embodiments, as shown in FIG. 4B, there are more than two (such as three) layers stacked with an alternating pattern, wherein III-V compound semiconductor layers 22A, 22B, and 22C may also be formed of III-V compound semiconductor materials selected from InAs, AlAs, GaAs, InP, GaN, InGaAs, InAlAs, GaSb, AlSb, AlP, GaP, and the like.

Figure 5:
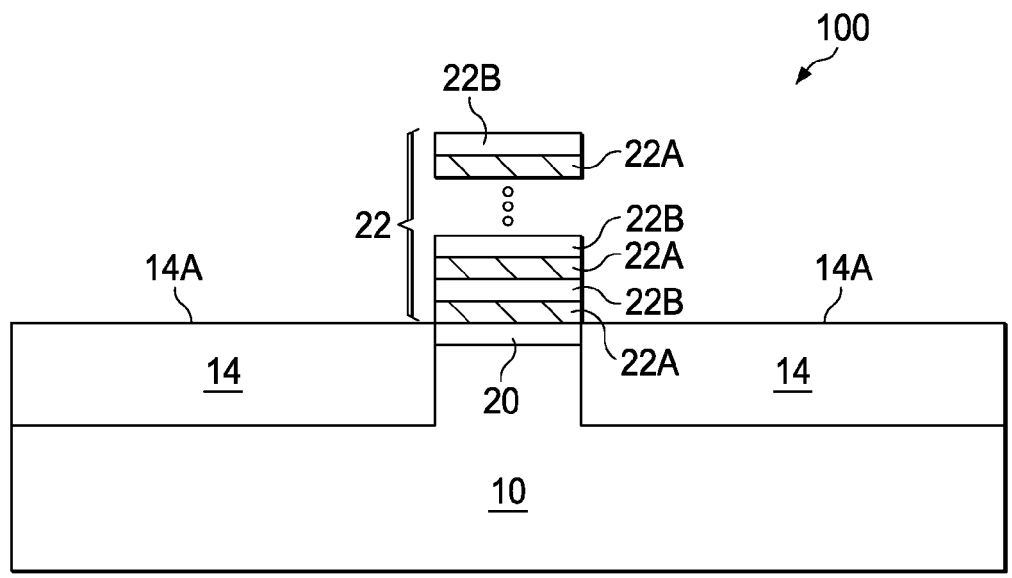

Referring to FIG. 5, STI regions 14 are recessed, for example, through an etching step. The top surfaces 14A of the remaining STI regions 14 may be level with or higher than the interface between III-V compound semiconductor region 22 and buffer layer 20, if any. Accordingly, the sidewalls of buffer layer 20 may be in contact with the sidewalls of remaining STI regions 14. Alternatively, top surfaces 14A may be level with or higher than the interface between III-V compound semiconductor region 22 and substrate 10 if no buffer layer 20 is formed.

Figure 6A:
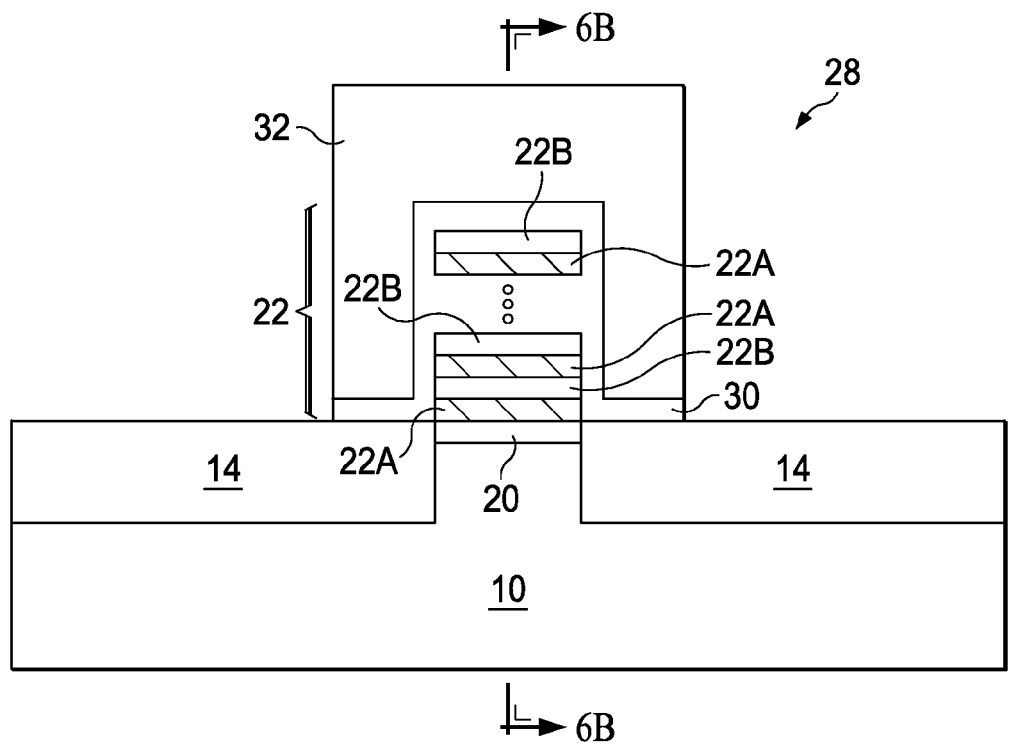
Figure 6B:
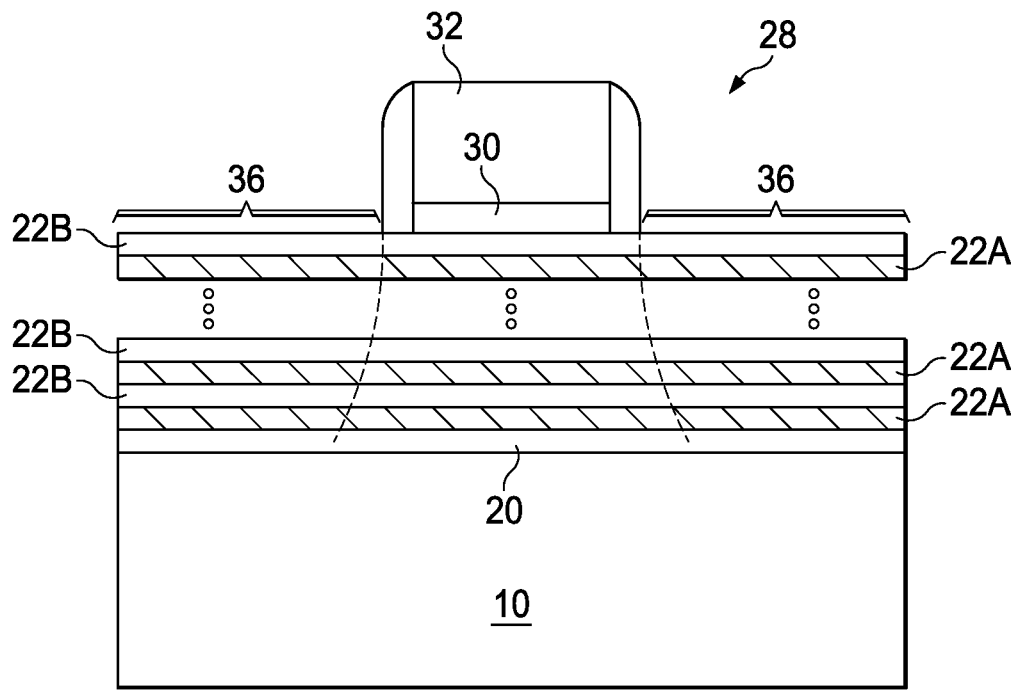

The structure shown in FIG. 5 may be used to form FinFET 28, as shown in FIGS. 6A and 6B. Referring to FIG. 6A, gate dielectric 30 and gate electrode 32 are formed. Gate dielectric 30 may be formed of a dielectric material such as silicon oxide, silicon nitride, an oxynitride, multi-layers thereof, and combinations thereof. Gate dielectric 30 may also be formed of high-k dielectric materials. The exemplary high-k materials may have k values greater than about 4.0, or even greater than about 7.0. Gate electrode 32 may be formed of doped polysilicon, metals, metal nitrides, metal silicides, and the like. The bottom ends of gate dielectric 30 may contact the top surface of STI regions 14. After the formation of gate dielectric 30 and gate electrode 32, source and drain regions 36 (FIG. 6B) may be formed.

FIG. 6B illustrates a cross-sectional view of FinFET 28, wherein the cross-sectional view is obtained from the plane crossing line 6B-6B in FIG. 6A. It is observed that the channel region of FinFET 28 are formed of III-V compound semiconductor region 22, which may have the stacked layers with alternating III-V compound semiconductor layers. In some embodiments, source/drain regions 36 of FinFET 28 may include alternating III-V compound semiconductor layers 22A and 22B. Accordingly, source/drain regions 36 may comprise the same III-V compound semiconductor materials comprised in the channel region of FinFET 28. Alternatively, source/drain regions 36 of FinFET 28 may be recessed, and other semiconductor materials such as silicon germanium, silicon carbon, or the like, may be regrowth. Accordingly, source/drain regions 36 of FinFET 28 may not have the stacked layers with alternating III-V compound semiconductor layers. As a result, source/drain regions 36 may comprise a semiconductor material different from the III-V compound semiconductor materials in the channel region of FinFET 28.

Figure 7:
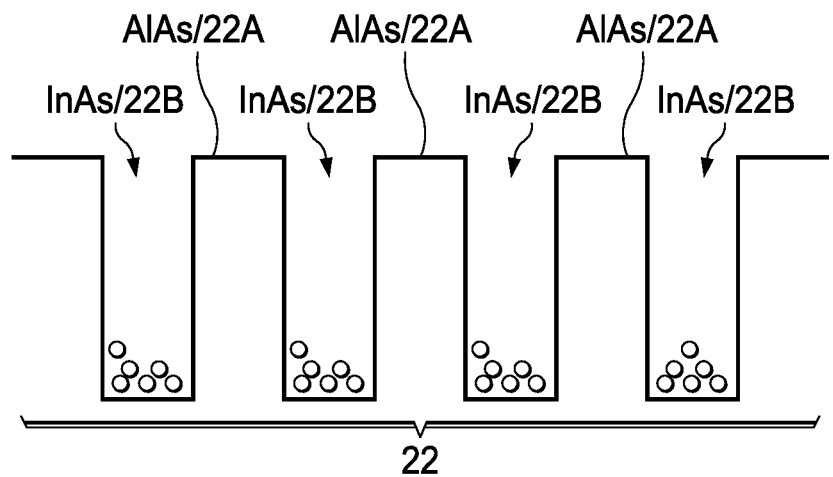
FIG. 7 schematically illustrates the conduction bands of neighboring III-V compound semiconductor layers in the fin of the FinFET.

In the embodiments, with two or more III-V compound semiconductor layers that have different band gaps stacked with an alternating pattern, a plurality of quantum wells may be formed in the III-V compound semiconductor layers that have the small band gaps. For example, FIG. 7 illustrates the conduction bands of layers 22A and 22B (FIG. 4A) that are formed of AlAs and InAs, respectively. It is observed that each of the InAs layers forms a quantum well between two neighboring AlAs layers. The plurality of multiple quantum wells confines the carriers in the quantum wells, which quantum wells have a low energy band gap, and hence the leakage current of the resulting FinFET 28 (FIGS. 6A and 6B) is reduced. In addition, the plurality of quantum wells forms a plurality of channels that are located between the source and drain regions of the FinFET. The drive current of the resulting FinFET is also increased.

In accordance with embodiments, a device includes insulation regions over portions of a semiconductor substrate, and a III-V compound semiconductor region over top surfaces of the insulation regions, wherein the III-V compound semiconductor region overlaps a region between opposite sidewalls of the insulation regions. The III-V compound semiconductor region includes a first and a second III-V compound semiconductor layer formed of a first III-V compound semiconductor material having a first band gap, and a third III-V compound semiconductor layer formed of a second III-V compound semiconductor material between the first and the second III-V compound semiconductor layers. The second III-V compound semiconductor material has a second band gap lower than the first band gap. A gate dielectric is formed on a sidewall and a top surface of the III-V compound semiconductor region. A gate electrode is formed over the gate dielectric.

In accordance with other embodiments, a device includes a semiconductor substrate and a FinFET. The FinFET includes a III-V compound semiconductor region over a portion of the semiconductor substrate and forming a fin of the FinFET. The III-V compound semiconductor region includes a first plurality of III-V compound semiconductor layers formed of a first III-V compound semiconductor material having a first band gap, and a second plurality of III-V compound semiconductor layers formed of a second III-V compound semiconductor material having a second band gap different from the first band gap. The first and the second plurality of III-V compound semiconductor layers are stacked with an alternating pattern. A gate dielectric is formed on sidewalls and a top surface of the III-V compound semiconductor region. A gate electrode is formed over the gate dielectric.

In accordance with yet other embodiments, a method includes forming insulation regions in a semiconductor substrate, etching a portion of the semiconductor substrate between opposite sidewalls of the insulation regions to form a trench, and performing an epitaxial growing step to form a III-V compound semiconductor region in the trench. The epitaxial growing step includes performing a first plurality of growing steps to grow a first III-V compound semiconductor material as a first plurality of III-V compound semiconductor layers, wherein the first III-V compound semiconductor material has a first band gap, and performing a second plurality of growing steps to grow a second III-V compound semiconductor material as a second plurality of III-V compound semiconductor layers. The second III-V compound semiconductor material has a second band gap lower than the first band gap. The first and the second plurality of growing steps are performed with an alternating pattern.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure.

Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
a fin field-effect transistor (FinFET) comprising:
   a III-V compound semiconductor region over a portion of the semiconductor substrate and forming a fin of the FinFET, wherein the III-V compound semiconductor region comprises:
      a first plurality of III-V compound semiconductor layers formed of a first III-V compound semiconductor material having a first band gap;
      a second plurality of III-V compound semiconductor layers formed of a second III-V compound semiconductor material having a second band gap different from the first band gap; and
      a third plurality of III-V compound semiconductor layers formed of a third III-V compound semiconductor material having a third band gap different from the first band gap and the second band gap, wherein the first, the second, and the third plurality of III-V compound semiconductor layers are stacked with an alternating pattern;
   a gate dielectric on sidewalls and a top surface of the III-V compound semiconductor region; and
   a gate electrode over the gate dielectric.

2. The device of claim 1 further comprising shallow trench isolation (STI) regions in the semiconductor substrate and comprising sidewalls facing each other, wherein the III-V compound semiconductor region is disposed over a region that is between the sidewalls of the STI regions.

3. The device of claim 2 further comprising a buffer layer under the III-V compound semiconductor region, wherein the buffer layer comprises sidewalls contacting the sidewalls of the STI regions, and wherein the buffer layer has a lattice constant between a lattice constant of the semiconductor substrate and lattice constants of the first and the second III-V compound semiconductor materials.

4. The device of claim 3, wherein the buffer layer comprises InGaAs.

5. The device of claim 1, wherein the first III-V compound semiconductor material comprises AlAs, and wherein the second III-V compound semiconductor material comprises InAs.

6. The device of claim 1, wherein source and drain regions of the FinFET comprise same III-V compound semiconductor materials as one of the first and the second plurality of III-V compound semiconductor layers.

7. The device of claim 1, wherein source and drain regions of the FinFET comprise a semiconductor material different from materials of the first and the second plurality of III-V compound semiconductor layers.

8. The device of claim 1, wherein the first band gap and the second band gap have a difference greater than about 0.2 eV.

9. A device comprising:
a semiconductor substrate;
a fin field-effect transistor (FinFET) comprising:
   a III-V compound semiconductor fin over a portion of the semiconductor substrate and forming a fin of the FinFET, wherein the III-V compound semiconductor fin comprises:
      a first plurality of III-V compound semiconductor layers formed of a first III-V compound semiconductor material having a first band gap;
      a second plurality of III-V compound semiconductor layers formed of a second III-V compound semiconductor material having a second band gap different from the first band gap; and
      a third plurality of III-V compound semiconductor layers formed of a third III-V compound semiconductor material having a third band gap different from the first band gap and the second band gap, wherein the first, the second, and the third plurality of III-V compound semiconductor layers are stacked with an alternating pattern;
   a gate dielectric on sidewalls and a top surface of the III-V compound semiconductor fin;
   a gate electrode over the gate dielectric; and
   a source region and a drain region connected to opposite ends of the III-V compound semiconductor fin.

10. The device of claim 9, wherein the first and the second plurality of III-V compound semiconductor layers extend into the source region and the drain region.

11. The device of claim 9 further comprising shallow trench isolation (STI) regions in the semiconductor substrate and comprising sidewalls facing each other, wherein the III-V compound semiconductor fin is disposed over a region that is between the sidewalls of the STI regions.

12. The device of claim 9 further comprising a buffer layer under the III-V compound semiconductor fin, wherein the buffer layer comprises sidewalls contacting the sidewalls of the STI regions, and wherein the buffer layer has a lattice constant between a lattice constant of the semiconductor substrate and lattice constants of the first and the second III-V compound semiconductor materials.

13. The device of claim 12, wherein the buffer layer comprises InGaAs.

14. The device of claim 9, wherein the first III-V compound semiconductor material comprises AlAs, and the second III-V compound semiconductor material comprises InAs.

15. The device of claim 9, wherein the source and drain regions of the FinFET comprise same III-V compound semiconductor materials as at least one of the first and the second plurality of III-V compound semiconductor layers.

16. The device of claim 9, wherein the source and drain regions of the FinFET comprise a semiconductor material different from materials of the first and the second plurality of III-V compound semiconductor layers.

17. The device of claim 9, wherein the first band gap and the second band gap have a difference greater than about 0.2 eV.

* * * * *